United States Patent
Nascimento et al.

(10) Patent No.: US 8,116,053 B2
(45) Date of Patent: Feb. 14, 2012

(54) ISOLATING DEVICE FOR A POWER SEMICONDUCTOR AND METHOD FOR ITS OPERATION, POWER MODULE AND SYSTEM INSTALLATION

(75) Inventors: Jair Do Nascimento, Dormitz (DE); Roland Bittner, Stegaurach (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 345 days.

(21) Appl. No.: 12/396,269

(22) Filed: Mar. 2, 2009

(65) Prior Publication Data

US 2009/0225485 A1 Sep. 10, 2009

(30) Foreign Application Priority Data

Feb. 28, 2008 (DE) .......................... 10 2008 011 597

(51) Int. Cl.
*H02H 3/08* (2006.01)

(52) U.S. Cl. ...................................... 361/93.1; 361/104

(58) Field of Classification Search ................. 361/93.1, 361/104

See application file for complete search history.

(56) References Cited

U.S. PATENT DOCUMENTS

| | | | | |
|---|---|---|---|---|
| 3,309,478 A | * | 3/1967 | Kiesel et al. | ....................... 337/7 |
| 4,764,838 A | * | 8/1988 | MacFarlane | .................... 361/21 |
| 5,596,466 A | | 1/1997 | Ochi | |
| 2005/0099751 A1 | | 5/2005 | Kumagai | |

FOREIGN PATENT DOCUMENTS

| | | |
|---|---|---|
| DE | 196 00 807 | 8/1996 |
| EP | 1 630 923 | 3/2006 |
| FR | 2 851 855 | 9/2004 |
| GB | 1 204 650 | 9/1970 |
| JP | 59-165971 | 9/1984 |
| JP | 09 163583 | 6/1997 |
| JP | 2008-153615 | 7/2008 |

* cited by examiner

*Primary Examiner* — Rexford Barnie
*Assistant Examiner* — Tien Mai
(74) *Attorney, Agent, or Firm* — Roger S. Thompson

(57) ABSTRACT

An isolating device for a power semiconductor comprising n power terminals for a power grid comprises n module terminals, n grid terminals, n connecting lines which connect the module terminals and grid terminals and have overcurrent fuses, and a tripping controller. The tripping controller includes a detector for detecting the rupture of an overcurrent fuse and a tripping unit for tripping an overcurrent fuse. A power module contains a power semiconductor and an isolating device. A system installation contains at least two power modules connected in parallel. In a method for operating an isolating device, at least one of the overcurrent fuses is tripped upon a predetermined tripping criterion being met.

14 Claims, 2 Drawing Sheets

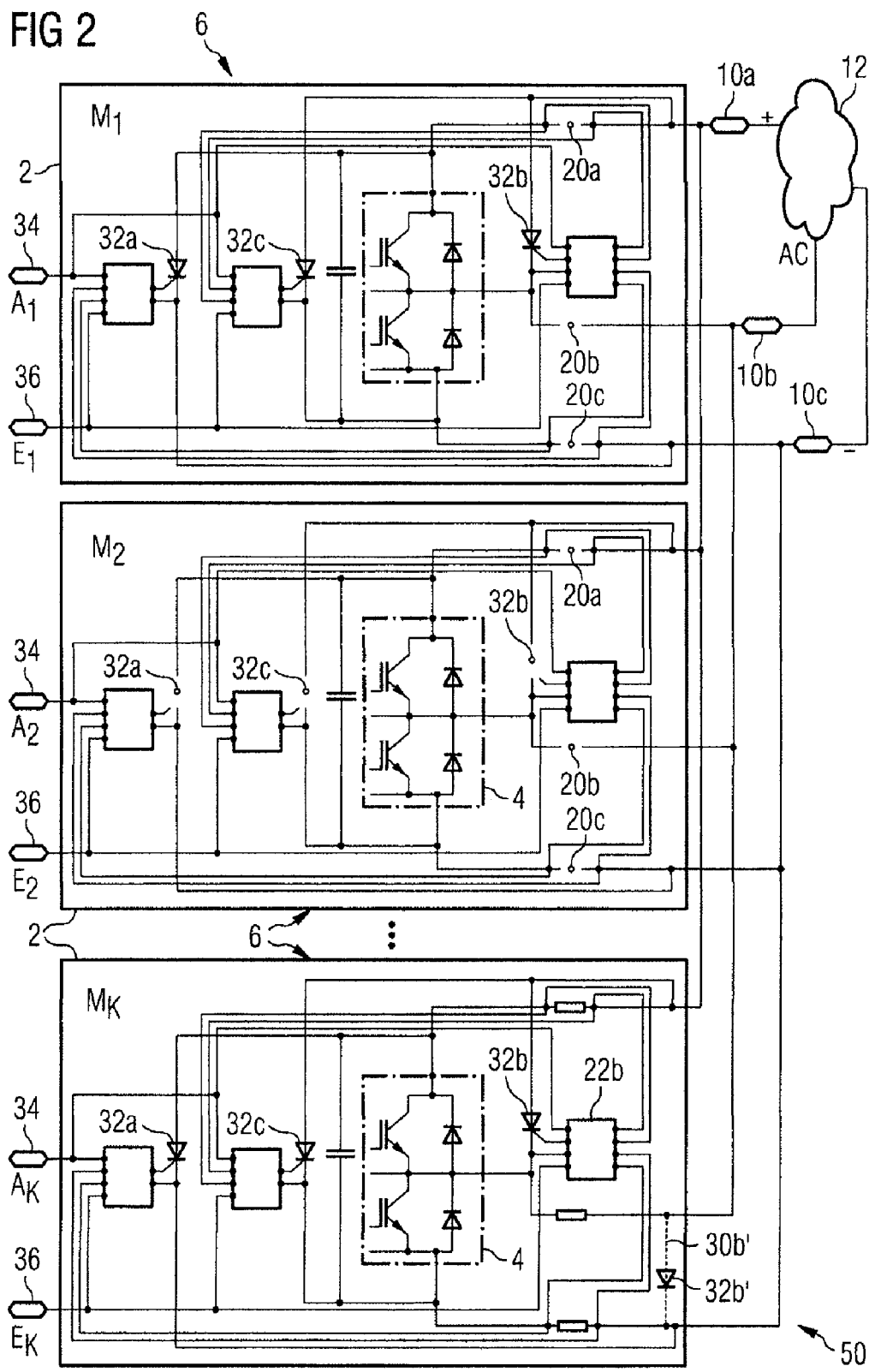

ISOLATING DEVICE FOR A POWER SEMICONDUCTOR AND METHOD FOR ITS OPERATION, POWER MODULE AND SYSTEM INSTALLATION

BACKGROUND OF THE INVENTION

1. Field of the Invention

This invention is directed to an isolating device for a power semiconductor and, more particularly, to such an isolating device that is capable of being triggered upon the occurrence of a predetermined condition.

2. Description of the Related Art

Electrical system installations, such as wind power generators, in which high voltages or currents are switched are equipped nowadays with so-called power modules. A power module contains one or more power semiconductors, e.g. in the form of an IGBT half-bridge. By way of example, a short circuit or ground fault from the power module to the system ground can be effected as a result of the destruction or failure of a single power module. Upon failure of a corresponding power module, it is known to switch off the system installation, remove the destroyed power module and then replace it or repair it. After a fault-free power module has been inserted, the system installation is put into operation again. Such a failure of a power module therefore leads to a sudden or unplanned interruption or disturbance of the operation of the system installation and hence to considerable costs.

Many system installations have a plurality of power modules which are generally operated in parallel to increase the total system power. If a single power module fails in the case of e.g., massive parallelization, the overall system power would actually fall only slightly. Despite possibly intact parallel or redundant power modules, however, operation of the installation cannot be maintained, e.g., in the case of a short circuit in a single defective module. The complete installation must be shut down due to a single defective power module.

SUMMARY OF THE INVENTION

It is an object of the invention to provide an improved isolating device and a method for eliminating the disadvantages mentioned above.

With regard to the inventive isolating device, the object is achieved by means of an isolating device which serves as a ballast for a power semiconductor or other power module and can be operated together therewith. Such a power semiconductor has a number of "n" power terminals, by means of which it can be connected to a power grid. If the power semiconductor is a half-bridge, for example, it has three terminals, namely a "+" terminal and a "−" terminal for a DC voltage intermediate circuit and an "AC" terminal for a phase of an AC grid.

The isolating device therefore includes a corresponding number of n module terminals which can be connected to the power terminals of the power semiconductor and n grid terminals for connection to the power grid. Furthermore, the isolating device has n connecting lines, each of which connects a respective grid terminal to a respective module terminal. Each connecting line contains an overcurrent fuse.

The isolating device contains a tripping controller connected to at least two, but generally all, overcurrent fuses. The tripping controller contains a detector for detecting the rupture of at least a first one of the fuses, and a tripping unit for tripping at least a second one of the overcurrent fuses.

In other words, the isolating device can therefore be connected in n-pole fashion between a power grid and a power semiconductor. In this case, each pole is safeguarded by an overcurrent fuse; that is to say that with an intact fuse the corresponding poles are through-connected, and, with a tripped or ruptured fuse, the respective power terminal of the power semiconductor is isolated from the corresponding pole of the power grid. The detector monitors the overcurrent fuses to determine if any has failed. The tripping unit serves for the targeted tripping of the overcurrent fuses.

The inventive isolating device provides the advantage that the detector notices a fuse rupture indicating a fault in the power semiconductor. The tripping controller can then trip relevant fuses by means of the tripping unit, which isolates from the power grid other or remaining power terminals of the power semiconductor that are defective or that might cause problems if they remain connected to the power grid. After the tripping of the fuse, the power grid is thereafter no longer loaded by the power semiconductor, e.g., by a short circuit or ground fault and can continue to be operated. With the aid of the isolating device, therefore, the power grid can be maintained in operation, albeit at a reduced capacity, even if some power semiconductor fails.

The invention thus makes it possible to avoid interruption of operation in a system installation, to save costs and to ensure further operation of the system installation in a manner not influenced by the failure of the module. This is a considerable advantage, particularly in the case of energy generating installations such as wind-driven generators.

In one preferred configuration of the invention, the detector and/or the tripping unit are/is assigned in each case to all the overcurrent fuses. The isolating device thus has, in the first case, a complete diagnostic possibility and, in the second case, also complete controllability for the isolation of any or all power terminals of the power semiconductor from the power grid. As necessary, the entire power semiconductor can thus be isolated from the power grid completely, that is to say with all n terminals.

In a further preferred embodiment of the invention, the overcurrent fuse is a fusible link. In principle, the isolating device can also be constructed with automatic circuit-breakers. However, this leads to considerable costs particularly in the case of massively parallel system installations, such as, e.g., a wind power installation comprising many parallel power modules. By contrast, a fusible link is cost-effective, for which reason the entire isolating device becomes cost-effective.

In the case of an automatic circuit-breaker, a tripping unit that actuates a tripping mechanism on the fuse would be possible. Particularly in conjunction with a fusible link, however, in a further preferred embodiment, the tripping unit is configured such that, for tripping an overcurrent fuse, it applies to the overcurrent fuse, in a targeted manner, an overcurrent fed to the fuse in the power or fuse path. The tripping unit, therefore, feeds the fuse an overcurrent on its actual power path leading to the tripping of the fuse. Such an overcurrent, too, can be generated simply and cost-effectively by a tripping unit and thus lower the cost of the isolating device. In the dimensioning of the tripping unit, it is important that the minimum factor $i^2t$ that can be generated by the tripping device is greater than the maximum permissible factor $i^2t$ of the fuse to be destroyed, to ensure its destruction.

For the purpose of feeding overcurrent, in one advantageous configuration, the tripping unit has a tripping line which is connected to the current path, that is to say directly to the overcurrent fuse. The tripping line can be switched at high impedance when quiescent and at low impedance for tripping, the tripping line connecting the overcurrent fuse to a voltage source. In other words, in the case of such an isolating device, a switched connection to a voltage source is produced which is closed as necessary to send a suitable tripping current through the overcurrent fuse from the voltage source. In this case, a "voltage source" is a representative term that includes other similar devices such as for example, a current source.

In a particularly preferred embodiment, the voltage source is the power grid assigned to the power semiconductor. The power grid itself is thus used for tripping the overcurrent fuses, which renders the provision of an additional voltage source superfluous. In general, any power grid to which a power semiconductor is connected is capable of tripping a corresponding fuse, namely of generating a sufficiently high tripping current.

In a further preferred embodiment, the tripping line leads from a module terminal of the isolating device to a grid terminal not assigned to the module terminal. A grid terminal that is not assigned is, in this case, one which does not lead parallel to the line routing of the connecting line associated with the module terminal. In other words, by means of a corresponding tripping line, a cross-connection is produced between different poles of the power semiconductor or power grid, which generally have sufficient voltages to generate sufficiently high tripping currents as necessary in the tripping line.

In a further advantageous embodiment, the switchability of the tripping line is achieved by virtue of the fact that the tripping line contains a thyristor which can be activated for tripping, and a triggering unit assigned to said thyristor. In particular in conjunction with a fusible link, a thyristor is particularly well suited to current generation since it blocks in both current directions in the quiescent state and, with regard to its current characteristic, matches one of the fusible links well, takes up little chip area in this case and is generally particularly robust. The ability of the thyristor to trip the fuse is ensured.

In a further advantageous embodiment, the isolating device has a signal input for the targeted tripping of at least one of the overcurrent fuses. Thus, a power semiconductor can be isolated from the power grid in single-, multi- or full-pole fashion in a targeted manner by means of a signal applied to the signal input externally. This may be desirable, for example, if the power semiconductor has reached its estimated service life and, to be on the safe side, is intended to be deactivated during planned maintenance, so that it may be isolated from the latter, before it fails in an uncontrolled manner and in the process causes a short circuit or the like. Such a signal input can be connected, e.g., to a superordinate controller or control centre which monitors or controls the system installation.

In a further advantageous embodiment, the isolating device also has a signal output correlated with the rupture of at least one of the overcurrent fuses, e.g., for fault feedback. Consequently, a signal is available which provides information about the failure of at least one of the fuses and can be processed further, e.g., in the superordinate controller. Thus, e.g. the failure of a power module can be detected or else localized. A corresponding power module can therefore be identified, e.g., for maintenance. In this case, diagnostic feedback and intervention possibilities can additionally be supplemented by measured value acquisition at the tripping instant, position indications of the fault messages, etc.

The object of the invention is also achieved by means of a power module comprising a power semiconductor and an above-described isolating device assigned thereto. The interface to the power grid is furthermore constituted by the power terminals of the isolating device, into which the power semiconductor is then integrated.

The object of the invention is also achieved by means of a system installation containing at least two power modules which are parallelized at their grid terminals of the isolating devices, as just described above. Such a system installation according to the invention generally even comprises a multiplicity of parallelized power modules which are connected differently, depending on the application; in this case, each of the power modules has an isolating device as explained above for the targeted tripping of the fuses and hence isolation of an individual power module from the system installation.

Thus, two—also combinable—guidelines exist for the design of a system installation according to the invention:

Either a sufficient redundancy of power modules can be provided, that is to say that the power modules in total have a power exceeding the rated system power. Thus, the system installation can continue to be operated with full rated power even after the destruction of one or a few of the power modules.

A second possibility is to provide no redundant power modules, and to reduce the system power in the event of failure to the extent which corresponds to the loss in power of the number of destroyed power modules.

Therefore, a system installation of this type does not have to be suddenly stopped in order to work with corrective maintenance in the case of a fault, rather, preventive maintenance can be carried out, that is to say that a destroyed power module or power module isolated from the system by the isolating device can be replaced, at a later point in time when a shutdown of the installation is tolerable or favorable.

With regard to the method, the object is achieved by means of a method for operating an isolating device as described above, wherein at least one of the overcurrent fuses is tripped upon a tripping criterion being met. In particular, it is also possible, of course, as described above, for all the overcurrent fuses to be tripped upon the occurrence of the tripping criterion.

The tripping criterion is, as likewise described, e.g., a signal applied in a targeted manner at the signal input, e.g., upon the expected life of a power module being exceeded, or else, as described above, in a preferred embodiment of the method, the rupture of at least one of the fuses monitored by the detector in the isolating device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For a further description of the invention, reference is made to the exemplary embodiments in the drawings, in which, in each case in a basic schematic diagram:

FIG. 2 shows a system installation with K power modules in accordance with FIG. 1.

DETAILED DESCRIPTION OF THE PRESENTLY PREFERRED EMBODIMENTS

Figure 1:
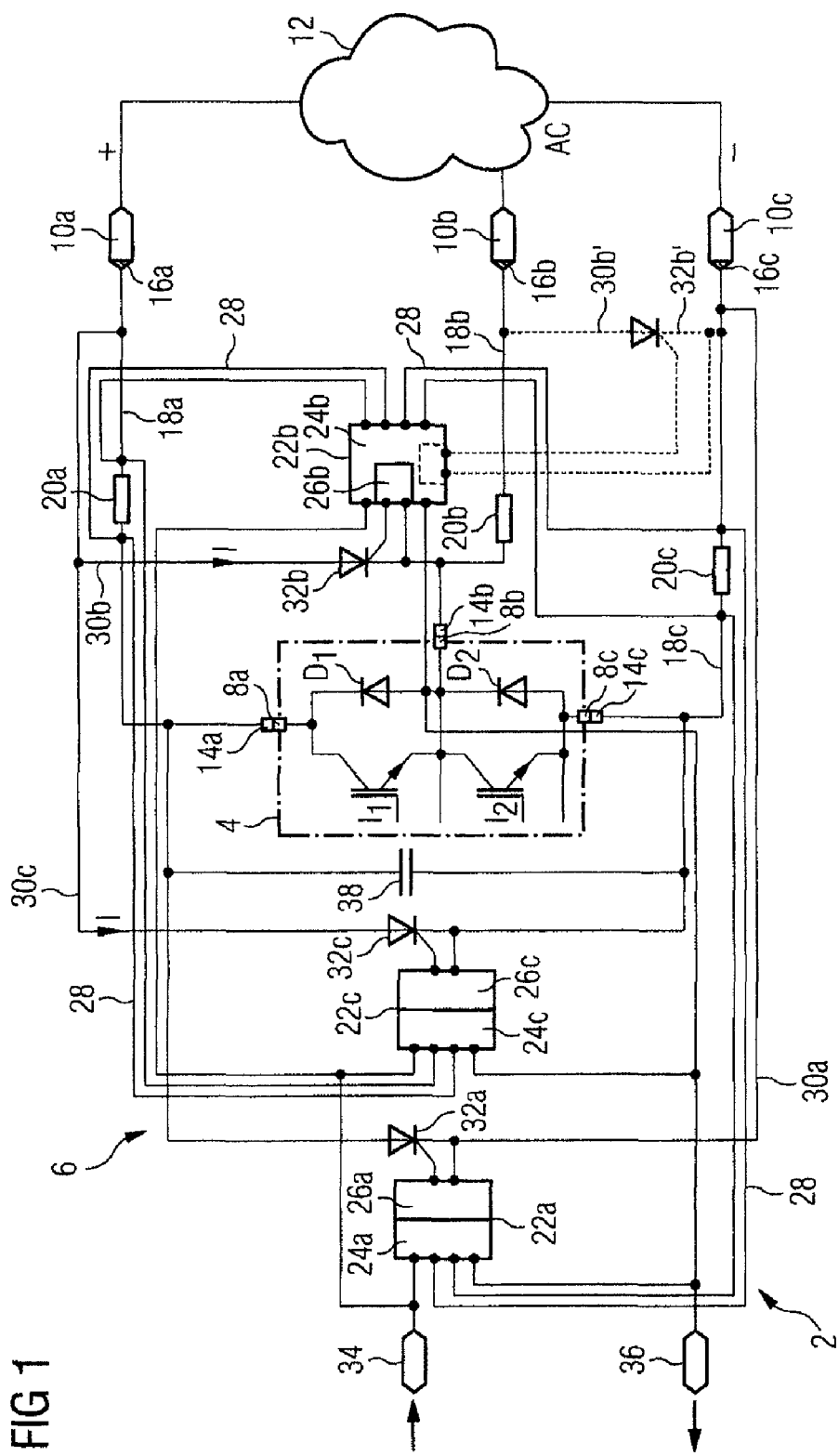
FIG. 1 shows a power module with isolating device and power semiconductor at a power grid.

FIG. 1 shows a power module 2 containing, as a power semiconductor, a half-bridge 4 having two IGBTs I1 and I2 and diodes D1 and D2. Power module 2 also comprises an isolating device 6, which surrounds half-bridge 4 and which therefore does not include half-bridge 4. Half-bridge 4 has n=3 power terminals 8a-c connected to three poles 10a-c of a power grid 12. Poles 10a and 10c are poles "+" and "−" of a DC intermediate circuit (not illustrated); pole 10b is a phase AC of an AC grid (not illustrated).

In FIG. 1, according to the invention, the inventive isolating device 6 is connected between power grid 12, or the poles 10a-c thereof, and the power terminals 8a-c of half-bridge 4.

For this purpose, isolating device 6 has three module terminals 14a-c for power terminals 8a-c, respectively on the one hand, and three grid terminals 16a-c for poles 10a-c, on the other hand. Each module terminal 14a-c is connected to each grid terminal 16a-c by a respective connecting line 18a-c, which in turn respectively comprises a fuse 20a-c in the form of a fusible link.

Isolating device 6 additionally contains a three-part tripping controller in the form of tripping modules 22a-c, which are in each case divided into respective detectors 24a-c and triggering units 26a-c.

In this case, detectors 24a,c are each connected via measurement lines 28 to a respective fuse 20a,c, and detector 24c is connected to both fuses 20a,c. Via the measurement lines, each detector 24a-c monitors the respective voltage drop across the corresponding fuse 20a,c. In an alternative embodiment (not illustrated), fuse 20b is also monitored by the detectors 24a-c via a measurement line 28.

Each triggering unit 26a-c in turn is connected to a respective thyristor 32a-c contained in a respective tripping line 30a-c. Tripping lines 32a-c bridge half-bridge 4 in each case, as can be seen in FIG. 1, such that upon through-connection of the respective tripping line, a fuse 20a-c respectively lies in a current path running between poles 10a-c.

Each detector 24a-c is additionally provided with an input and output connected to a tripping input 34 and to a fault output 36.

FIG. 1 shows a capacitor 38, which compensates for the parasitic inductances of fuses 20a-c with respect to half-bridge 4. In other words, capacitor 38 is a so-called snubber capacitor that serves to suppress the overvoltages during the commutation of the IGBTs $I_1$ and $I_2$.

In semiconductor power modules such as half-bridge 4, in most cases of destruction breakdown, faults arise between different layers of the semiconductors, that is to say that short circuits arise between power terminals 8a-c and a system ground (not illustrated). This can lead to very high short-circuit currents at poles 10a-c of power grid 12. At least one fuse 20a-c blows in the case of a fault situation of this type.

In the description below, fuse 20a blows as a result of a fault in half-bridge 4. However, it is also conceivable for a different one of the fuses to blow first.

Tripping module 22c detects a voltage drop at fuse 20a in detector 24c via measurement line 28 and activates triggering unit 26a, i.e., thyristor 32c. Via tripping line 30c, an overcurrent I flows from pole 10a through fuse 20c to pole 10c, which leads to the destruction of fuse 20c. In such a case, fuse 20b should already likewise be tripped by the fault in half-bridge 4. For the case where this has not occurred, however, detector 24b detects the blowing of fuses 20a, c and activates thyristor 32b via the triggering unit 26b, for which reason overcurrent I flows from pole 10a to pole 10b via tripping line 30b and fuse 20b ruptures. This also applies to the case where, e.g., pole 10 is subjected to a DC voltage and pole 10b to an AC voltage when the first period of the AC voltage has passed.

Since all three fuses 20a-c are now destroyed, half-bridge 4 is completely insulated from power grid 12, which can continue to be operated in a manner free of faults.

FIG. 1 shows, using dashed lines, an alternative embodiment of an isolating device 6, which contains, in addition to tripping line 30b, a further tripping line 30b' with thyristor 32b', which is likewise driven via triggering unit 26b. For the controlled blowing of fuse 20b, a tripping path between poles 10a and 10c of power grid 12 thus also arises via the tripping lines 30b and 30b'.

The respective detection of a destroyed fuse 20a-c via measurement lines 18 is output by respective detector 24a-c in the form of a fault signal at fault output 36. From there, the signal can, e.g., be forwarded to a superordinate controller or control centre (not illustrated) and be processed further, said controller or control centre thus being informed about destroyed power module 2. Moreover, by means of a signal fed in by such a controller at tripping input 34, all tripping modules 22a-c can also be activated without the prior rupture of a fuse 20a-c, to destroy all three fuses 20a-c in a targeted manner.

The respective tripping module 22a-c generally has a potential isolation lying between the terminals for measurement lines 28 and for thyristors 32a-c or the terminals for tripping input 34 and fault output 36.

Thyristors 32a-c are triggered only for the time required for the reliable tripping of fuses 20a-c. Since the thyristors always have a connection to the system installation (not illustrated) in which power module 2 is integrated, a creepage path possibly present in the destroyed half-bridge 4 could otherwise be closed, which would then lead to a creepage current and impair the interference immunity of the entire system installation.

For the case where fuse 20b blows first, this is initially not noticed since fuse 20b, in accordance with FIG. 1 is not monitored. In the case of such a fault, however, one of fuses 20a, c always blows as well, since the fault in half-bridge 4 also leads to a short circuit with respect to the poles "+" or "−". The rupture of one of fuses 20a, c is then detected and the further procedure as described above is adopted.

Half-bridge 4 in FIG. 1 should be understood merely as an example. It can also be replaced by any desired power semiconductor circuit, whereupon the topology of isolating device 6 would have to be adapted accordingly, as would be appreciated by one of ordinary skill in the art as a matter of mere design choice.

FIG. 2 shows a system installation 50 comprising a number of K power modules 2, designated by $M_1$ to $M_K$. All the modules $M_1$ to $M_K$ are connected in parallel at their poles 10a-c. Tripping inputs 34 and fault outputs 36 are identified individually as inputs $A_1$ to $A_K$ and outputs $E_1$ to $E_K$ for each module $M_1$ to $M_K$ and led separately to the superordinate controller. Thus, each individual module $M_1$ to $M_K$ can be separately tripped or isolated from power grid 12 or a fault therein can be diagnosed and therefore also localized.

The example of FIG. 2 illustrates how half-bridge 4 in module $M_2$ is completely isolated from the grid. Fuses 20a-c have blown and are no longer illustrated, for the purpose of clarification. After the module $M_2$ has been isolated, thyristors 32a-c are switched off again and thus represent an electrical open circuit; likewise clarified by their omission in FIG. 2.

FIG. 2 thus reveals how all the power lines leading from power grid 12 end at an open end in module $M_2$. The remaining K−1 power modules 2 in the system installation 50 therefore continue to operate as normal.

The solution with the additional thyristor 32b' and tripping line 30b' as shown by dashed lines in FIG. 1 is illustrated only in module $M_K$ in FIG. 2. For such a system interconnection, it is evident that closing thyristor 32b' would pull all connections of the phases "AC" of all the other K−1 power modules 2 to the pole "−" and the entire system installation 50 would thereby be loaded. For turned-on IGBTs $I_2$ in other power modules 2, here the respective fuses 20b would blow, since a short-circuit current path arises via this fuse and module M or thyristor 32b'. In power module $M_K$, therefore, tripping module 22b has an integrated function which monitors the voltages between the phase "AC" and the pole "−" and triggers thyristor 32b' only when the voltage between phase "AC" and pole "−" lies below a defined threshold. Consequently, no state deviating from normal operation is produced at the phase "AC" and the power modules $M_1$ to $M_{K-1}$ are not loaded.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An isolating device for a power semiconductor comprising n power terminals for a power grid, the isolating device comprising
   n module terminals capable of being connected to the n power terminals;
   n grid terminals capable of being connected to the power grid;
   n connecting lines, each capable of connecting a respective module terminal to a respective grid terminal and containing an overcurrent fuse; and
   a tripping controller connected to said overcurrent fuses having:
      a detector for detecting the rupture of at least a first one of the overcurrent fuses and,
      a tripping unit for tripping at least a second one of the overcurrent fuses.

2. The isolating device of claim 1, wherein at least one of said detector and said tripping unit is assigned in each case to all said overcurrent fuses.

3. The isolating device of claim 1, wherein said overcurrent fuse is a fusible link.

4. The isolating device of claim 1, wherein the tripping unit is capable of tripping said overcurrent fuse in response to an overcurrent.

5. The isolating device of claim 4, wherein said tripping unit has a tripping line which is connected to said overcurrent fuse and is capable of being switched at high impedance when quiescent and at low impedance for tripping and is capable of being connected to a voltage source.

6. The isolating device of claim 5, wherein said voltage source is the power grid.

7. The isolating device claim 5, wherein said tripping line leads from a module terminal to a grid terminal not assigned thereto.

8. The isolating device of claim 5, wherein said tripping line includes a thyristor which can be activated for tripping, and a triggering unit assigned to said thyristor.

9. The isolating device of claim 1, comprising a signal input for the targeted tripping of at least one of the overcurrent fuses.

10. The isolating device of claim 1, further comprising means for generating a signal output upon the rupture of at least one of said overcurrent fuses.

11. A power module comprising:
    a power semiconductor; and
    an isolating device having:
    n power terminals for a power grid,
       n module terminals capable of being connected to the n power terminals;
       n grid terminals capable of being connected to the power grid;
       n connecting lines capable of connecting a respective module terminal to a respective grid terminal and containing an overcurrent fuse; and
       a tripping controller connected to said overcurrent fuses having:
          a detector for detecting the rupture of at least a first one of the overcurrent fuses and,
          a tripping unit for tripping at least a second one of the overcurrent fuses.

12. The power module of claim 11, further comprising a second power module connected in parallel thereto.

13. A method for operating an isolating device comprising an isolating device for a power semiconductor having n power terminals for a power grid, the isolating device including
    n module terminals capable of being connected to the n power terminals;
    n grid terminals capable of being connected to the power grid;
    n connecting lines capable of connecting a respective module terminal to a respective grid terminal and containing an overcurrent fuse; and
    a tripping controller connected to said overcurrent fuses having:
       a detector for detecting the rupture of at least a first one of the overcurrent fuses and,
       a tripping unit for tripping at least a second one of the overcurrent fuses,
    wherein at least one of said overcurrent fuses is tripped upon the occurrence of a predetermined tripping criterion.

14. The method of claim 13, wherein said tripping criterion is the rupture of at least one of said fuses.

* * * * *